Nov. 17, 1953 W. R. SCHUM 2,659,777
COMPRESSION AMPLIFIER FOR RADIO CIRCUITS
Filed Feb. 9, 1950
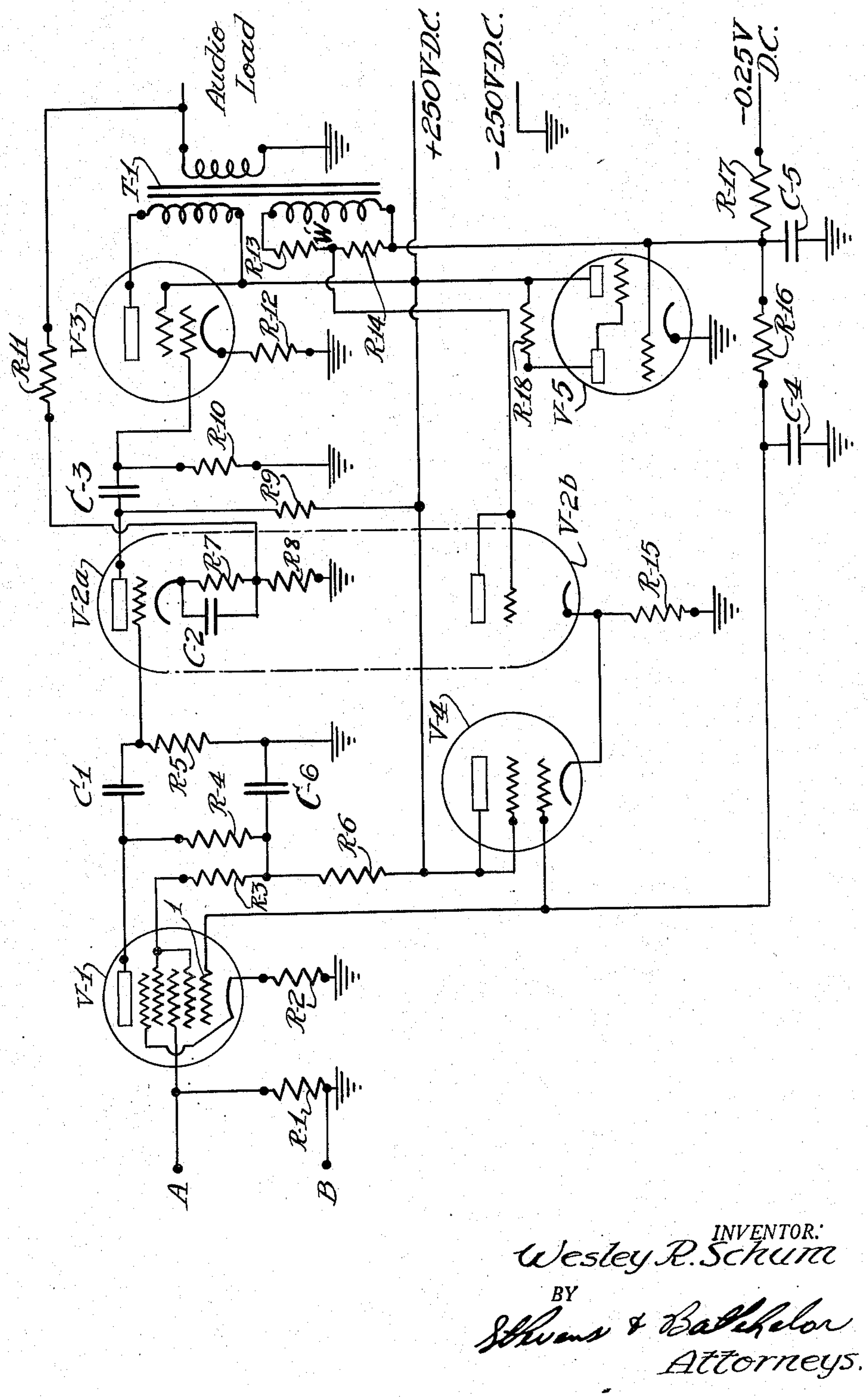
INVENTOR.
Wesley R. Schum
BY
Stevens & Batchelor
Attorneys.

Patented Nov. 17, 1953 2,659,777

UNITED STATES PATENT OFFICE 2,659,777

COMPRESSION AMPLIFIER FOR RADIO CIRCUITS

Wesley R. Schum, Chicago, Ill.

Application February 9, 1950, Serial No. 143,217

2 Claims. (Cl. 179—171)

My invention relates to compression amplifying radio circuits, or those which have an electronic or automatic volume control action which functions in a manner to cause signals picked up by the amplifier to be nearly equalized in output amplitude. The compression amplifier is a circuit which converts the alternating currents resulting from the signal energy picked up into a D. C. voltage varying in proportion to the signal amplitude. This voltage can be applied as a grid bias to control the gain of the amplifier in proportion to the signal level. Thus, the louder the signal, the more the compression; and, compression resulting in instantaneous gain reduction, the weaker input signals will appear as strong in the amplifier output as the stronger input signals.

In providing a compression amplifier with a specially-controlled—or "gated"—characteristic, one object of the invention is to develop full power from very weak signals, yet guard against "blasting" in case a sudden strong signal enters the input of the amplifier.

A further object is to provide an amplifier with means operative to limit the output rise, or volume increase in the case of an audio-amplifier, to less than 3 db in the event of the excessive input signal or noise impact referred to.

Another object is to provide means in an amplifier circuit effective to withhold compression until the output signal intensity has reached a level corresponding to, say, 3 db below the desired maximum amplifier output, whereby to bring weak input signals up to nearly full output before compression starts to reduce the gain of the amplifier.

An additional object is to design a wide range low distortion "gated" compression circuit with means accepting an increase in the input signal as much as 40 db, for example, after compression begins with a resulting output rise of only 2 db, for example which is equivalent to accepting an increase in the input signal 10,000 times which results in a corresponding output signal rise of only 1.5 times.

Another object is to provide, in an amplifier, a compression circuit inoperative until a predetermined output signal level obtains, and thereafter operative upon further increase in output signal level to reduce the gain of the amplifier by disproportionately increasing amounts relative to further output signal increases.

A further object is to include in the novel amplifier, a control tube effective to lower the "gating" value of signal amplification dynamically during compression.

A still further object is to include in the amplifying circuit a "gated" or delayed diode compression rectifier having a dynamically controlled bias.

Another object is to employ a visual compression indicator in the form of an electronic ray tube commonly known as a tuning eye.

A final object is to employ an amplifier whose parts are few and readily obtainable.

With the above objects in view, reference is made to the accompanying drawing, in which a circuit diagram of the amplifier is shown.

The principal units in the circuit include five vacuum tubes. The first tube is marked V–1 and is of the pentagrid converter type known on the market as 6BE6. The second tube is a dual triode known as 12AX7 and marked V–2*a* and V–2*b*, with the latter connected as a diode. The third and fourth tubes, marked V–3 and V–4, are known as 6AQ5 and of the pentode type; and the fifth tube, marked V–5, is known as 6E5 and comprises an electronic ray tuning indicator. A number of resistors are employed and marked progressively from R–1 to R–18. T–1 is the output transformer; and other factors in the circuit will be identified in the following description of its operation.

The diagram indicates the signal input terminals at A and B. The signal voltage is developed across the resistor R–1, causing the input grid of tube V–1 to control the plate current thereof through the resistor R–4. The amplified signal voltage is developed across resistor R–4 through the coupling of capacitor C–1 across the resistor R–5 to control the plate swing of tube V–2*a*, the signal appearing across resistor R–9 through the coupling capacitor C–3 across the resistor R–10 to the grid of tube V–3. The plate of the latter is transformer-coupled by T–1 to a load (not shown). The transformer T–1 has a third winding W, which may be called the compression winding. A voltage divider formed by resistors R–13 and R–14 connected across the winding W applies a voltage proportional to the amplified output signal to the plate and grid of tube V–2*b*, connected as a diode. The cathode of the latter is connected to the cathode of tube V–4, and this connection is led through resistor R–15 to the ground. The plate and screen grid of tube V–4 are connected to a positive 250-volt D. C. source, from which current will flow through tube V–4, developing a positive voltage across resistor R–15. The current flow through tube V–4 is dependent upon the negative voltage amplitude developed at its grid. This voltage will be equal to a fixed negative bias, shown here as a negative easier charging and discharging of these capacitors by the rectified signal, and reducing charging thumps, etc.

It is apparent from the above description that a number of significant values are gained by the instant development. A negative bias is applied to the smoothing capacitor C–5 to lessen the charging delay and prevent positive voltage accumulation on capacitor C–5. Further, a control tube is introduced to hold the output rise of the amplifier to a narrow margin after compression starts. Further, a control tube is had which lowers the "gating" value dynamically during compression. Further, a "gated" or delayed diode compression rectifier is included with a dynamically controlled bias. Further, a tuning eye or meter calibrated in decibels is used as an indicator of compression. An automatic volume control is thus had which accomplishes a tremendous signal gain, while the hum and noise output is down over 60 db from the full output. Further, the addition of a microphone preamplifier stage ahead of tube V–1 in combination with this novel circuit makes possible an acoustic gain such as 130 db, extending the conversational range of the user. Further, with the instant circuit the microphone sensitivity control may be reduced where several conversations are going on in different parts of a room, so that the user may listen to the one nearest the microphone, and be assured that, for any setting of the sensitivity control in the present "gated" compression circuit, he is protected against pain and distortion induced by excessive sound absorption.

While I have described the invention along specific lines, various minor changes or refinements may be made therein without departing from its principle, and I reserve the right to employ all such changes and refinements as may come within the scope and spirit of the appended claims.

I claim:

1. In an amplifier having input and output circuits, and an amplifying discharge device connected between said circuits and inversely responsive in its amplification factor to the magnitude of a negative biasing potential; a compression circuit comprising, in combination, a transformer winding inductively coupled with the output circuit and a circuit including a first resistor connected across the winding and energized therefrom, the voltage across said first resistor being thereby proportional to the output signal of the amplifier; a rectifier, a second resistor connected to the cathode of the rectifier, and a capacitor all connected in series with said first resistor whereby conduction of the rectifier in response to voltage across said first resistor charges the capacitor to a negative voltage; connecting means supplying said negative capacitor voltage as a bias to the amplifying device; a control discharge device having an anode for connection to a constant voltage source, a cathode connected to said rectifier cathode, and a control electrode connected to said capacitor to receive the negative capacitor voltage; current conduction by said control device thereby creating a voltage across said second resistor which opposes conduction by said rectifier; whereby an increase in the output signal of the amplifier increases the voltage across said first resistor, which in turn causes said rectifier to conduct and charge said capacitor negatively, thereby reducing the amplification factor of the amplifying device and reducing the current through said control device, the latter change reducing the opposing voltage across said second resistor to permit the rectifier to charge said capacitor still more negatively to disproportionally further decrease said amplification factor.

2. In an amplifier having input and output circuits, and an amplifying discharge device connected between said circuits and inversely responsive in its amplification factor to the magnitude of a negative biasing potential; a compression circuit comprising, in combination, means coupled to the output circuit for providing source of voltage varying proportionally with the output signal of the amplifier, a rectifier, a resistor connected to the cathode of the rectifier, and a capacitor all connected in series relation with said source of voltage; conduction by said rectifier serving to charge said capacitor to a negative voltage, connecting means for supplying said negative capacitor voltage as a controlling bias to the amplifying discharge device; a control discharge device having an anode, a control electrode and a cathode; means connecting said cathode to said rectifier cathode in series relation with said resistor such that current flowing through the control device and resistor creates a voltage drop across the latter opposing conduction of said rectifier; and means supplying said negative capacitor voltage to said control electrode to vary the current conduction of said control device; whereby as the output signal of the amplifier increases, the rectifier conducts to charge said capacitor negatively and thereby to reduce the amplification factor of the amplifying discharge device, and current through said control device decreases to reduce the opposing voltage across the resistor, thus permitting the rectifier to charge the capacitor still more negatively to dynamically further reduce the amplification factor of the amplifying discharge device.

WESLEY R. SCHUM.

References Cited in the file of this patent

UNITED STATES PATENTS

| Number | Name | Date |
|---|---|---|
| 2,185,612 | Trevor | Jan. 2, 1940 |
| 2,207,905 | Weagant | July 16, 1940 |
| 2,428,039 | Royden | Sept. 30, 1947 |
| 2,462,452 | Yates | Feb. 22, 1949 |
| 2,466,229 | Goldberg | Apr. 5, 1949 |
| 2,521,493 | Van Beck | Sept. 5, 1950 |
| 2,524,985 | Mayne | Oct. 10, 1950 |